(12) United States Patent
Venkatasubramanian et al.

(10) Patent No.: US 8,375,265 B1
(45) Date of Patent: Feb. 12, 2013

(54) DELAY FAULT TESTING USING DISTRIBUTED CLOCK DIVIDERS

(75) Inventors: Ramakrishnan Venkatasubramanian, Plano, TX (US); Alan Hales, Richardson, TX (US); William Wallace, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 13 days.

(21) Appl. No.: 13/231,229

(22) Filed: Sep. 13, 2011

(51) Int. Cl.
*G01R 31/28* (2006.01)
(52) U.S. Cl. ........................ 714/731; 714/727
(58) Field of Classification Search ............... 365/201; 714/726, 742, 744, 731
See application file for complete search history.

(56) References Cited

U.S. PATENT DOCUMENTS

| | | | | |
|---|---|---|---|---|
| 6,877,123 B2 * | 4/2005 | Johnston et al. | ............... | 714/731 |
| 7,689,885 B2 * | 3/2010 | Kaibel et al. | ............... | 714/731 |
| 7,710,801 B2 * | 5/2010 | Li | ............... | 365/201 |
| 7,793,179 B2 * | 9/2010 | Sul | ............... | 714/726 |
| 7,840,861 B2 * | 11/2010 | Sul | ............... | 714/726 |
| 2007/0061657 A1 * | 3/2007 | Chang et al. | ............... | 714/742 |

* cited by examiner

*Primary Examiner* — David Ton
(74) *Attorney, Agent, or Firm* — John R. Pessetto; W. James Brady; Frederick J. Telecky, Jr.

(57) ABSTRACT

In an embodiment of the invention, an integrated circuit with several clock domains bank is tested by first disabling a PLL clock and scanning test data into scan chains. Next delay fault testing (DFT) code is transmitted to each distributed clock divider on the integrated circuit. The PLL clock is then enabled to the distributed clock dividers. Selected clock dividers generate launch pulses that allow test data to be propagated from the scan chains into circuit blocks in the clock domains. Capture pulses are then generated by selected distributed clock dividers to capture test data coming form the circuit blocks into the scan chains. Next the PLL clock is disabled and the test data is scanned from the scan chains to an on-chip test control circuit.

20 Claims, 4 Drawing Sheets

DELAY FAULT TESTING USING DISTRIBUTED CLOCK DIVIDERS

BACKGROUND

Integrated circuits (ICs) often contain millions of transistors and millions of interconnections. To verify that these transistors and interconnections operate as intended, they must be tested. Many testing techniques may be used to verify the operation of an IC.

For example, broadside testing includes electrically stimulating the inputs of an IC and measuring the outputs of the IC to determine if the output matches the predicted output. In the case where the predicted output matches the measured output, the IC may be functioning correctly. However, this test alone does not guarantee that the IC will function 100 percent correctly. More tests are needed to verify that the IC is operating as designed.

In the case where broadside testing is used and the measured output does not match the predicted output, the IC may not be operating correctly. This type of testing indicates that there may be problems with the IC. However, this type of testing usually does not indicate what in particular caused the IC to operate incorrectly. To better diagnose what may be causing the IC to fail, delay fault testing may be used.

Delay fault testing or "at-speed" testing is a test methodology used to measure the time required for a signal to travel through a block of circuits (e.g. logic, memory etc.) on an integrated circuit. This time is often called the delay time Td. Usually, the frequency F at which an integrated circuit may operate is determined by the longest delay time Td on the integrated circuit. In this case, the highest clock frequency that the integrated circuit may operate is $F=1/Td$.

Integrated circuits often have more than one clock domain. Each clock domain may operate at a different frequency from the other clock domains. Distributed clock dividers as shown in FIG. 1 are used to provide the clock frequencies CLK1, CLK2, CLK3, ClK4 needed for each clock domain. In this example, a full speed clock CLK is provided by a phase-locked loop (PLL) 110 to each distributed clock dividers 102, 104, 106 and 108. A divide ratio DR1, DR2, DR3 and DR3 is provided to each distributed clock divider 102, 104, 106 and 108 respectively. The divide ratio determines the frequency of the clocks CLK1, CLK2, CLK3 and CLK4 output by the distributed clock dividers 102, 104, 106 and 108 respectively. Clocks CLK1, CLK2, CLK3 and CLK4 are used to provide clocks to circuits in clock domains 112, 114, 116 and 118 respectively.

Delay times Td need to be measured in each clock domain 112, 114, 116 and 118 in order to fully test an integrated circuit. The control of these tests may be accomplished by the use of an on-chip test control circuit. In an embodiment of the invention, the on-chip test control circuitry sends code to each clock domain 112, 114, 116 and 118. In this embodiment, the code sent to each of the distributed clock dividers 102, 104, 106 and 108 selects the type of distributed clock divider used and the delays between the pulses needed to delay fault test clock domains on an integrated circuit.

DETAILED DESCRIPTION

The drawings and description, in general, disclose a method of delay fault testing integrated circuits that contain one or more clock domains. A clock domain contains circuits that operate at a specific clock frequency. An integrated circuit may contain many clock domains. In an embodiment of the invention, an on-chip test control circuitry generates and sends code to distributed clock dividers after a phase-locked loop (PLL) clock has been disabled. Every clock domain contains a distributed clock divider that provides a clock to the clock domain that divides the PLL clock to a slower frequency.

The code sent to the distributed clock dividers, in this example, determines: (1) the delay time from when the PLL clock is enabled to the beginning of a launch pulse, (2) which type of distributed clock divider is selected to generate the launch pulse, (3) the delay time from when a launch pulse is generated to the time when a capture pulse is generated, and (4) which type of distributed clock divider is selected to generate the capture pulse.

After code is sent to the distributed clock dividers, the PLL clock is activated. A launch pulse is generated in the clock domains where distributed clock dividers have been selected by the code. The launch pulse then clocks test data from scan-in registers into circuit blocks contained in the selected clock domains. Test data from the outputs of the circuit blocks in the selected clock domains is then captured in a scan-out registers when the capture pulse is clocked. After test data is captured in the scan-out registers, the PLL clock is disabled. After the PLL clock is disabled, test data in the scan-out registers is shifted into the on-chip test control circuitry to be evaluated for delay faults.

Figure 1:
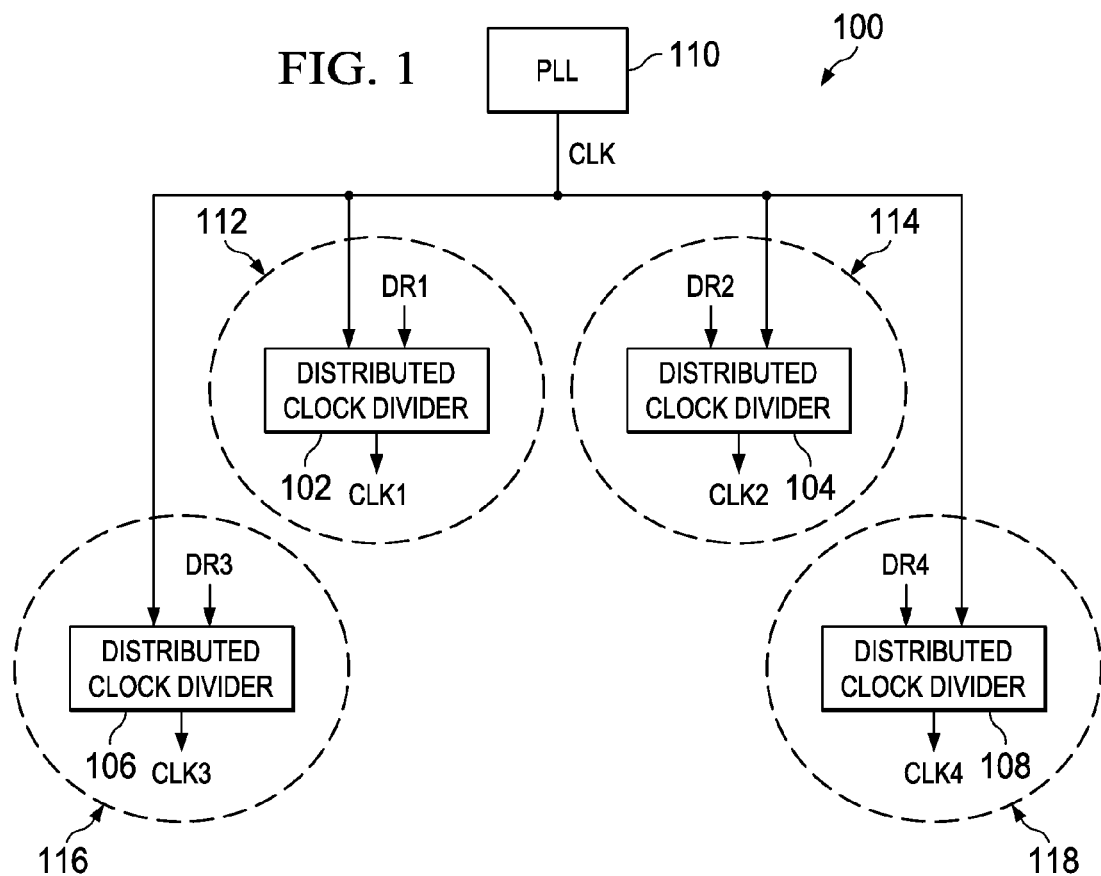
FIG. 1 is a block diagram of an embodiment of a clock tree and clock domains containing distributed clock dividers.
Figure 2:
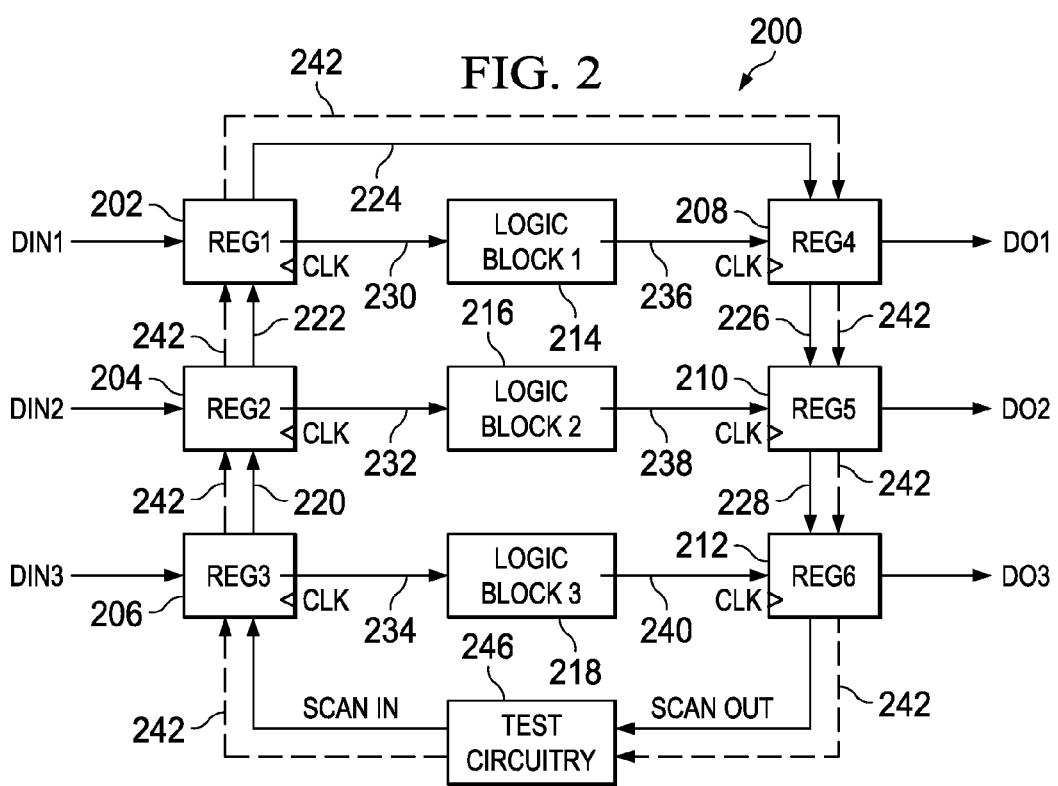
FIG. 2 is an embodiment of a scan path used to test three logic blocks.

FIG. 2 is a schematic drawing of an embodiment of a system 200 for testing logical blocks 214, 216 and 218 for delay faults using a scan chain 242. During normal operation (i.e. logical blocks are not being tested), the registers 202, 204 and 206 receive data from inputs DIN1, DIN2 and DIN3 respectively. After receiving the data, the registers 202, 204 and 206, during a first cycle of clock CLK, apply the data to the logic blocks 214, 216, and 218 respectively. The output, 236, 238 and 240, from the logic blocks 214, 216 and 218 respectively is stored in registers 208, 210 and 212 respectively. On the next cycle of clock CLK, the outputs DO1, DO2 and DO3 are output to other circuits (not shown).

In ATPG (automatic test pattern generation) test mode, test data is scanned into registers 202, 204 and 206 via the scan chain 242 from test circuitry 246. In this example, in order to scan test data into registers 202, 204 and 206, the scan chain is shifted three times. After the test data has been received by registers 202, 204 and 206, the test data is clocked into logic blocks 214, 216 and 218 respectively at the beginning of a clock cycle. During this time, the logic blocks 214, 216 and 218 are operated at a operational clock frequency. The test output data 236, 238 and 240 are driven into registers 208, 210 and 212 respectively before the end of the clock cycle.

After receiving the test output data, the scan chain 242 is shifted three times in order to drive the test output data into the test circuitry 246. After the test circuitry 245 receives the test output data, the test output data is observed to determine whether a delay fault has occurred in any of the logic blocks 214, 216 and 218.

Figure 3:
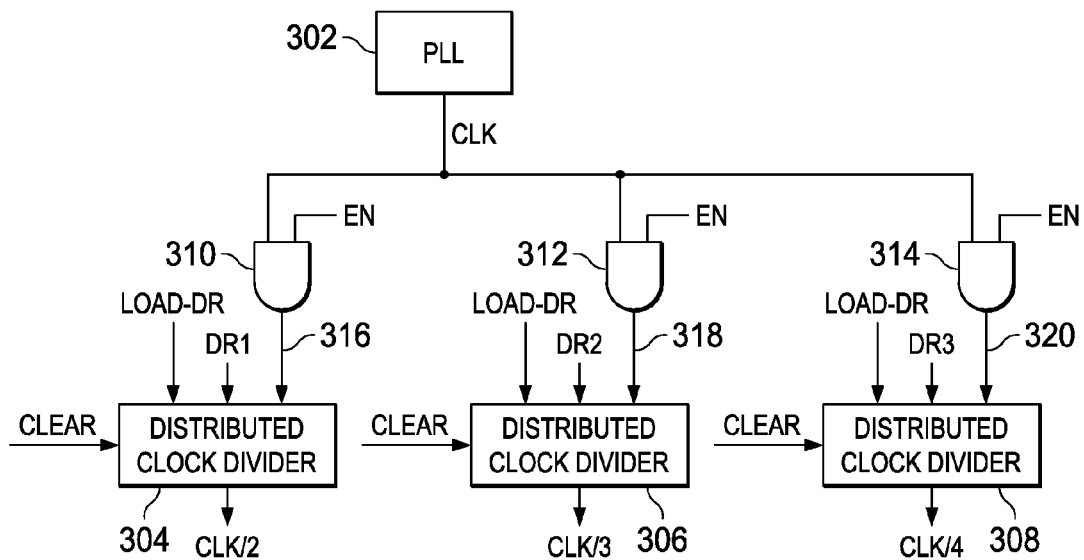
FIG. 3 is a schematic of an embodiment of a phase locked loop (PLL) and three distributed clock dividers.

FIG. 3 is a schematic of an embodiment of a phase locked loop (PLL) 302 and three distributed clock dividers 304, 306 and 308. In this embodiment, the PLL 302 outputs a clock signal CLK to three AND gates 310, 312 and 314. The other input to the three AND gates 310, 312 and 314 is the clock enable signal EN. The outputs 316, 318 and 320 of AND gates 310, 312 and 314 are input to distributed clock dividers 304, 306 and 308 respectively. The divide ratios DR1, DR2 and DR3 determine the value by which distributed clock dividers 304, 306 and 308 respectively divide clock signal CLK. The divide ratio, for example, may be a positive integer value n. The divide ratio may also be (n+0.5) where n is an integer value.

The distributed clock dividers 304, 306 and 308 are not required to change the divide ratios DR1, DR2 and DR3 on the fly. However, they may be changed on the fly by using the signal LOAD-DR. The signal CLEAR is used to asynchronously clear the divide registers and counters in the distributed dividers 304, 306 and 308. The distributed dividers 304, 306 and 308 shown in this example output clock signals CLK/2, CLK/3 and CLK/4 respectively. The output clock signals CLK/2, CLK/3 and CLK/4 provided clock signals to clock domains that operate at these frequencies.

Figure 4:
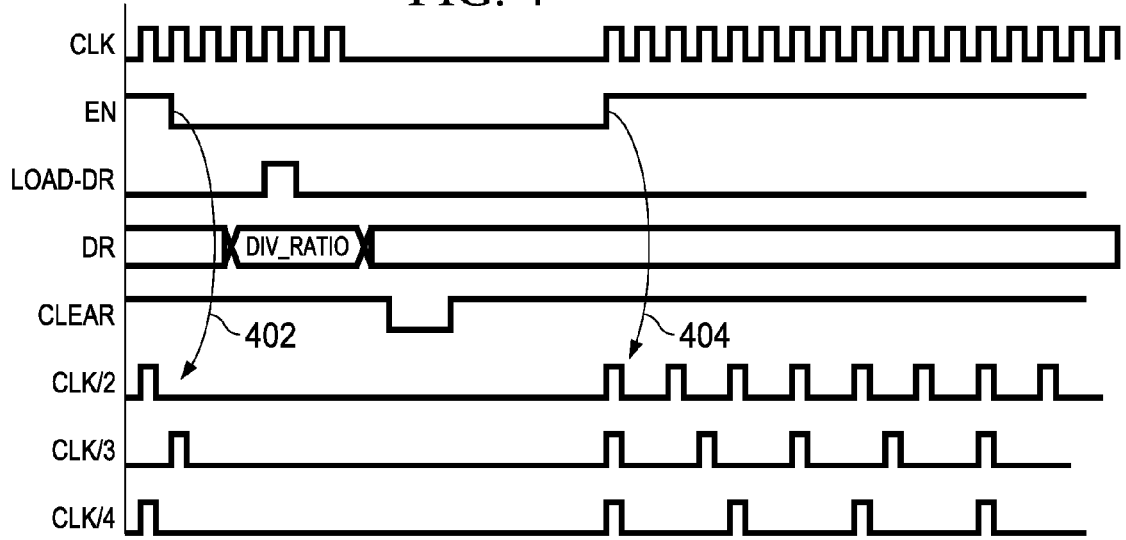
FIG. 4 is a timing diagram illustrating operation of the embodiment of the phase locked loop and distributed clock dividers shown FIG. 3.

FIG. 4 is a timing diagram illustrating the operation of the embodiment of the phase locked loop and distributed clock dividers shown FIG. 3. In this example, when EN is disabled (logical zero) nodes 316, 318 and 320 are driven to a logical zero. As a result, the outputs CLK/2, CLK/3 and ClK/4 are inactivated as shown by arrow 402. In this example, the divide ratio DR2 of distributed clock divider 306 may be changed by driving the load signal LOAD-DR to a logical high level for a short time. After changing divide ratios, the divide registers and counters in the distributed dividers 304, 306 and 308 are cleared by signal CLEAR.

When the enable signal EN is driven to a logical high value, clocks CLK/2, CLK/3 and CLK/4 begin oscillating as shown by arrow 404. The output CLK/2, CLK/3 and CLK/4 of distributed clock dividers 304, 306 and 308 respectively begin almost immediately after the rising edge of the enable signal EN. There is no significant latency between the PLL clock CLK and the output CLK/2, CLK/3 and CLK/4 of the distributed clock dividers 304, 306 and 308 respectively. Having a synchronous clock CLK where there is no significant latency between clock CLK and clocks CLK/2, CLK/3 and CLK/4 is used to ensure clock alignment across the circuits in the various time domains on an integrated circuit.

Figure 5:
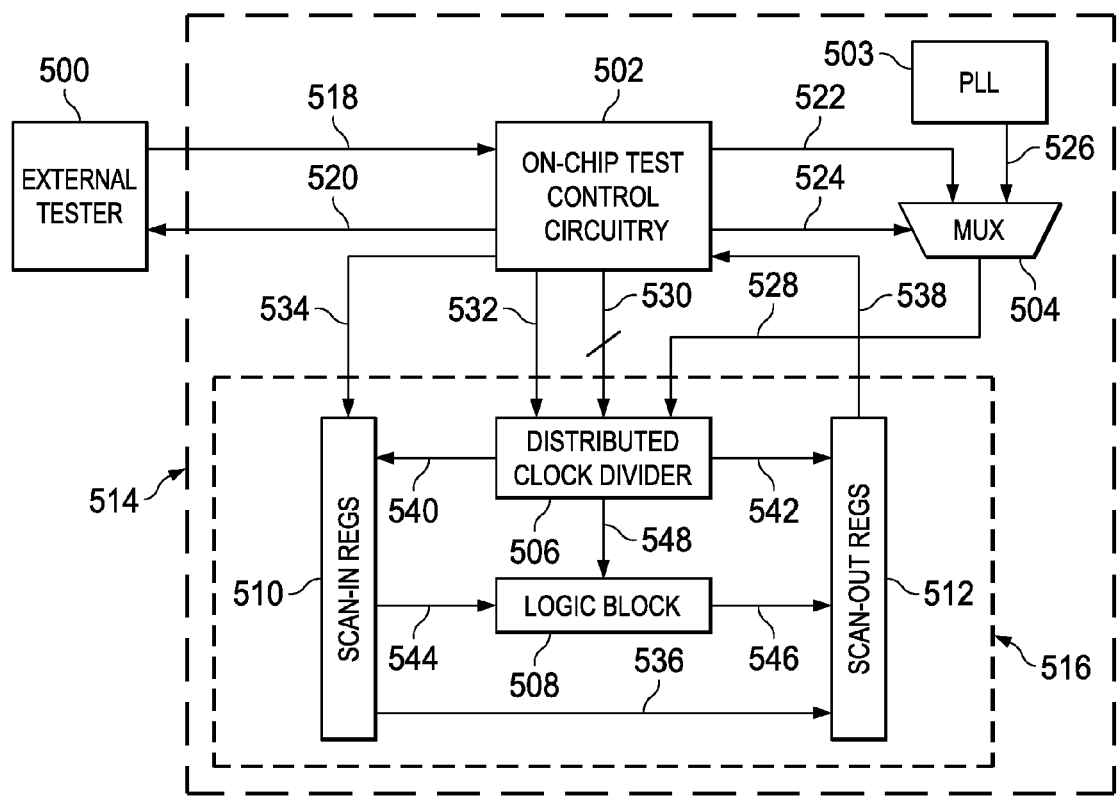
FIG. 5 is a block diagram of an embodiment of an integrated circuit containing a distributed clock divider and an on-chip test control circuitry for testing circuitry in a clock domain.
Figure 6:
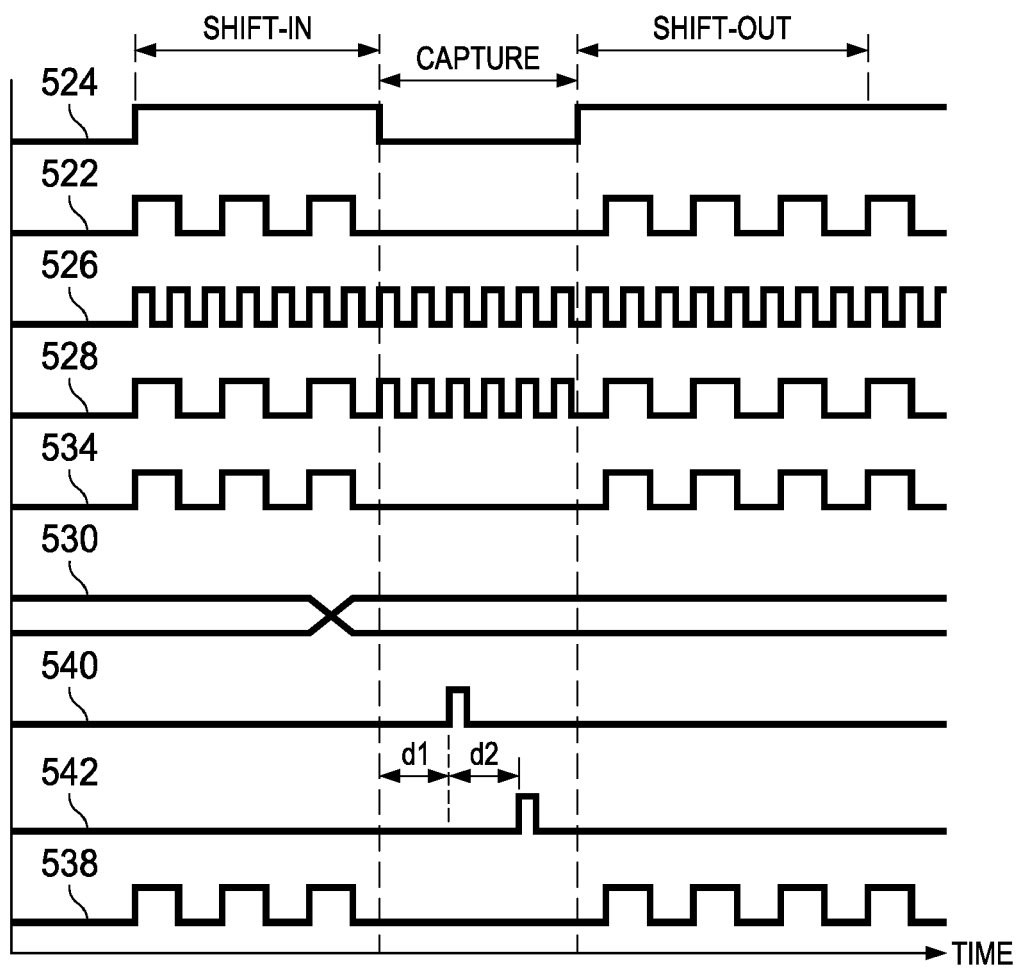
FIG. 6 is a timing diagram illustrating operation of an embodiment of an integrated circuit containing a distributed clock divider and an on-chip test control circuitry.

FIG. 5 is a block diagram of an embodiment of an integrated circuit 514 containing a distributed clock divider 506 and an on-chip test control circuitry 502 for testing circuitry (e.g. logic block 508) in clock domain 516. In a first example, during ATPG test mode (i.e. scan mode 524 is a logical high value), test data is scanned from the on-chip test control circuitry 502 into the scan-in register 510 (See FIG. 6). During ATPG test mode, the on-chip test control circuitry 502 through signal 524 selects the slower test clock signal 522 and deselects the faster PLL clock signal 526. The test clock signal 522 is then transferred to the node 528.

In this example, before the ATPG test mode 524 is inactivated, a code signal 530 is sent to the distributed clock divider 506. In addition, a divide ratio signal 532 may be send to the distributed clock divider 506 as well. The divide ratio signal 532 determines the ratio at which the PLL clock signal 526 will be divided to provide the distributed clock divider signal 548. The code signal 530 determines (1) the delay time d1 from when the scan mode 524 goes to a low logical value to the rising edge of the launch signal 540, (2) the type of distributed clock divider selected to create the launch signal 540, (3) the delay time d2 from the rising edge of the launch signal 540 to the rising edge of the capture signal 542, and (4) the type of distributed clock divider selected to create the capture signal 542.

After test data 534 is scanned into scan-in register 510, the ATPG test mode 524 is inactivated. Next, the on-chip test control circuitry 502 through signal 524 selects the PLL clock signal 526 and deselects the test clock signal 522. The PLL clock signal 526 is then transferred to the node 528. When distributed clock divider 506 is selected by the code signal 530, a launch signal 540 is sent to the scan-in registers 510 a time d1 after the scan mode 524 goes to a low logical level. The launch signal 540 enables the scan-in registers 510 to provide test data to logic block 508. The test data then propagates through the logic block 508. The output data from the logic block 508 is then captured in scan-out registers 512 when capture signal 542 is applied to the scan-out registers 512. The delay time d2 is the time allowed for the test data to propagate through the logic block 508.

After the test data is captured in the scan-out registers 512, the ATPG test mode 524 is activated. Next, the on-chip test control circuitry 502 through signal 524 selects the test clock signal 522 and deselects the PLL clock signal 526. The test clock signal 522 is then transferred to the node 528. Next, the test data in the scan-out registers is shifted to the on-chip test control circuitry 502. After the test data has been received by the on-chip test control circuitry 502, the on-chip test control circuitry 502 sends data to the external tester 500 where it can be determined if there are delay faults in the logic block 506.

In an embodiment of the invention, the code signal 530 is a 34 [33:0] bit word where a first portion [33:26] of the 34 bit word is used to determine the delay time d1 from when the scan mode 524 is goes to a low logical value to the rising edge of the launch signal 540. A second portion [25:17] of the 34 bit word is used to determine the type of distributed clock divider selected to create the launch signal 540. If the value provided by the second portion of the 34 bit word [25:17] matches the divide ratio value for a clock divider, the clock divider will generate a launch signal after a delay d1 specified by the first portion [33:26] of the 34 bit word.

A third portion [16:9] of the 34 bit word is used to determine the delay time d2 from the rising edge of the launch signal 540 to the rising edge of the capture signal 542. A fourth portion [8:0] of the 34 bit word is used to determine the type of distributed clock divider selected to create the capture signal 542. It should be noted that a launch signal may originate in one clock domain and a capture signal may originate in another clock domain to allow testing of circuits between clock domains.

Figure 7:
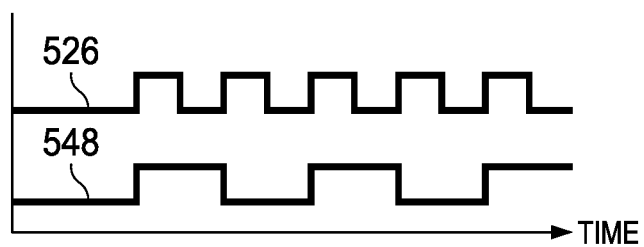
FIG. 7 is a timing diagram illustrating outputs from distributed clock dividers that have 50 percent duty cycle.

In the previous example, the launch signal 540 and the capture signal 542 were pulses. However, a launch signal and a capture signal may be generated such that they both have 50 percent duty cycles as shown in FIG. 7. The PLL clock signal 526 provided to the distributed clock divider 506 on node 528 may, for example, be divided by a ratio of 2. In this example, the divided output clock 548 has a 50 percent duty cycle as shown. A divided output clock 548 that has a 50 percent duty cycle may be used, for example, to test SRAM (static random access memory).

In the previous example, a single launch signal 540 and a single capture signal 542 were used during scan testing. The timing of these two signals was provided by the code signal 530, a 34 [33:0] bit word. However, more than one launch signal and more than one capture signal may be created using a larger code signal. For example, in another embodiment of the invention, two launch signals and two capture signals may be created by using a code signal that is a 68 [67:00] bit word.

The foregoing description has been presented for purposes of illustration and description. It is not intended to be exhaustive or to limit the invention to the precise form disclosed, and other modifications and variations may be possible in light of the above teachings. The embodiments were chosen and described in order to best explain the applicable principles and their practical application to thereby enable others skilled in the art to best utilize various embodiments and various modifications as are suited to the particular use contemplated. It is intended that the appended claims be construed to include other alternative embodiments except insofar as limited by the prior art.

What is claimed is:

1. A non-transitory computer readable medium carrying one or more sequences of instructions for causing a digital processing system to facilitate testing of an integrated circuit, wherein execution of said one or more sequences of instructions by one or more processors contained in said digital processing system for testing said integrated circuit causes said digital processing system to perform the actions of:
    disabling a phase-locked loop (PLL) clock connected to distributed clock dividers;
    shifting a first set of test data from an on-chip test control circuit into scan chains;
    generating delay fault testing (DFT) code from the on-chip test control circuit;
    transmitting the DFT code to the distributed clock dividers;
    enabling the PLL clock to the distributed clock dividers;
    generating launch pulses in the distributed clock dividers that are selected by the DFT code wherein the launch pulses are sent to test circuits in clock domains that contain the selected distributed clock dividers;
    generating capture pulses in the distributed clock dividers that are selected by the DFT code wherein the capture pulses are sent to test circuits in clock domains that contain the selected distributed clock dividers;
    capturing a second set of test data in scan chains;
    disabling the PLL clock to the distributed clock dividers;
    shifting the second set of test data from the scan chains to the on-chip test control circuit.

2. The non-transitory computer readable medium of claim 1 wherein the launch and capture pulses have a 50 percent duty cycle.

3. The non-transitory computer readable medium of claim 1 wherein a first portion of the DFT code controls a delay time from when the PLL clock is enabled to when the launch pulses are generated in the distributed clock dividers.

4. The non-transitory computer readable medium of claim 1 wherein a second portion of the DFT code selects the type of distributed clock divider that generates the launch pulses.

5. The non-transitory computer readable medium of claim 4 wherein the type of distributed clock divider is determined by a divide ratio of the distributed clock divider;
    wherein the divide ratio equals n where n is a positive integer value.

6. The non-transitory computer readable medium of claim 4 wherein the type of distributed clock divider is determined by a divide ratio of the distributed clock divider;
    wherein the divide ratio equals (n+0.5) where n is a positive integer value.

7. The non-transitory computer readable medium of claim 1 wherein a third portion of the DFT code controls a delay time from the time when the launch pulses are generated in the distributed clock dividers to the time when the capture pulses are generated in the distributed clock dividers.

8. The non-transitory computer readable medium of claim 1 wherein a fourth portion of the DFT code selects the type of distributed clock divider that generates the capture pulses.

9. The non-transitory computer readable medium of claim 8 wherein the type of distributed clock divider is determined by a divide ratio of the distributed clock divider;
    wherein the divide ratio equals n where n is a positive integer value.

10. The non-transitory computer readable medium of claim 8 wherein the type of distributed clock divider is determined by a divide ratio of the distributed clock divider;
    wherein the divide ratio equals (n+0.5) where n is a positive integer value.

11. A non-transitory computer readable medium carrying one or more sequences of instructions for causing a digital processing system to facilitate testing of circuits in a clock domain, wherein execution of said one or more sequences of instructions by one or more processors contained in said digital processing system for testing the circuits in the clock domain causes said digital processing system to perform the actions of:
    disabling a phase-locked loop (PLL) clock connected to a distributed clock divider located in the clock domain;
    shifting a first set of test data from an on-chip test control circuit into a scan chain;
    generating delay fault testing (DFT) code from the on-chip debugger circuit;
    transmitting the DFT code to the distributed clock divider;
    enabling the PLL clock to the distributed clock divider;
    generating a launch pulse in the distributed clock divider based on the DFT code wherein the launch pulse is sent to test circuits in the clock domain;
    generating a capture pulse in the distributed clock divider based on the DFT code wherein the capture pulse is sent to the test circuits in the clock domain;
    capturing a second set of test data in the scan chain;
    disabling the PLL clock to the distributed clock divider;
    shifting the second set of test data from the scan chain to the on-chip test control circuit.

12. The non-transitory computer readable medium of claim 11 wherein the distributed clock divider has a 50 percent duty cycle.

13. The non-transitory computer readable medium of claim 11 wherein a first portion of the DFT code controls a delay time from when the PLL clock is enabled to when the launch pulse is generated in the distributed clock divider.

14. The non-transitory computer readable medium of claim 11 wherein a second portion of the DFT code selects the type of distributed clock divider that generates the launch pulse.

15. The non-transitory computer readable medium of claim 14 wherein the type of distributed clock divider is determined by a divide ratio of the distributed clock divider;
    wherein the divide ratio equals n where n is a positive integer value.

16. The non-transitory computer readable medium of claim 14 wherein the type of distributed clock divider is determined by a divide ratio of the distributed clock divider;
    wherein the divide ratio equals (n+0.5) where n is a positive integer value.

17. The non-transitory computer readable medium of claim 11 wherein a third portion of the DFT code controls a delay time from the time when the launch pulse is generated in the distributed clock divider to the time when the capture pulse is generated in the distributed clock divider.

18. The non-transitory computer readable medium of claim 11 wherein a fourth portion of the DFT code selects the type of distributed clock divider that generates the capture pulse.

19. The non-transitory computer readable medium of claim 18 wherein the type of distributed clock divider is determined by a divide ratio of the distributed clock divider;

wherein the divide ratio equals n where n is a positive integer value.

20. The non-transitory computer readable medium of claim 18 wherein the type of distributed clock divider is determined by a divide ratio of the distributed clock divider;

wherein the divide ratio equals (n+0.5) where n is a positive integer value.

* * * * *